(12) United States Patent
Sasaki et al.

(10) Patent No.: US 10,319,558 B2
(45) Date of Patent: Jun. 11, 2019

(54) CHARGED PARTICLE BEAM DEVICE

(71) Applicant: Hitachi High-Technologies Corporation, Minato-ku, Tokyo (JP)

(72) Inventors: Yuko Sasaki, Tokyo (JP); Hiroyuki Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/022,662

(22) PCT Filed: May 2, 2014

(86) PCT No.: PCT/JP2014/062194
§ 371 (c)(1),
(2) Date: Mar. 17, 2016

(87) PCT Pub. No.: WO2015/045468
PCT Pub. Date: Apr. 2, 2015

(65) Prior Publication Data
US 2016/0233049 A1      Aug. 11, 2016

(30) Foreign Application Priority Data

Sep. 30, 2013   (JP) ................................. 2013-203290

(51) Int. Cl.
*H01J 37/153*       (2006.01)
*H01J 37/147*       (2006.01)
(Continued)

(52) U.S. Cl.
CPC ............ *H01J 37/153* (2013.01); *H01J 37/12* (2013.01); *H01J 37/141* (2013.01);
(Continued)

(58) Field of Classification Search
CPC ......... H01J 2237/103; H01J 2237/1532; H01J 2237/1534; H01J 37/12; H01J 37/141; H01J 37/147; H01J 37/153; H01J 3/12
See application file for complete search history.

(56) References Cited

U.S. PATENT DOCUMENTS 3,911,321 A * 10/1975 Wardly .................. H01J 29/706
                                                        250/396 ML
4,251,728 A *  2/1981 Pfeiffer ............... H01J 37/1475
                                                        250/396 ML
(Continued)

FOREIGN PATENT DOCUMENTS

DE       690 26 242 T2     10/1996
DE       197 39 290 A1      3/1999
(Continued)

OTHER PUBLICATIONS

German-language Office Action issued in counterpart German Application No. 11 2014 003 890.3 dated Jan. 5, 2017 with English translation (Eleven (11) pages).
(Continued)

*Primary Examiner* — Wyatt A Stoffa
(74) *Attorney, Agent, or Firm* — Crowell & Moring LLP

(57) ABSTRACT

Provided is a multifunctional charged particle beam device capable of inclining a beam with little aberration. The aberration is corrected by forming a local divergent field with a multipole, parallel current lines, or the like, matching the beam axis with the local divergent field via a conventional rotationally symmetric lens, deflector or astigmatism corrector, and counteracting an aberration occurring from another rotationally symmetric convex lens field.

14 Claims, 13 Drawing Sheets

(51) Int. Cl.
*H01J 37/141* (2006.01)
*H01J 37/12* (2006.01)
(52) U.S. Cl.
CPC ....... *H01J 37/147* (2013.01); *H01J 2237/103* (2013.01); *H01J 2237/1532* (2013.01); *H01J 2237/1534* (2013.01)

(56) References Cited

U.S. PATENT DOCUMENTS

| | | | | |
|---|---|---|---|---|
| 4,303,864 | A * | 12/1981 | Crewe | B82Y 15/00 250/396 R |
| 4,538,127 | A * | 8/1985 | Spicer | H01F 7/20 335/210 |
| 5,084,622 | A | 1/1992 | Rose | |
| 6,605,810 | B1 | 8/2003 | Haider et al. | |
| 6,646,267 | B1 | 11/2003 | Haider et al. | |
| 6,943,349 | B2 * | 9/2005 | Adamec | H01J 37/04 250/306 |
| 8,927,931 | B2 * | 1/2015 | Seoka | H01J 37/147 250/306 |
| 2003/0034457 | A1 | 2/2003 | Rose | |
| 2003/0111613 | A1 | 6/2003 | Rose | |
| 2008/0116391 | A1 * | 5/2008 | Ito | H01J 37/09 250/396 ML |
| 2009/0032722 | A1 * | 2/2009 | Ito | H01J 37/153 250/396 R |
| 2009/0134339 | A1 | 5/2009 | Uhlemann et al. | |
| 2012/0319001 | A1 * | 12/2012 | Tsunoda | H01J 37/12 250/396 R |
| 2013/0009070 | A1 * | 1/2013 | Onoguchi | H01J 37/12 250/396 R |
| 2016/0233049 | A1 * | 8/2016 | Sasaki | H01J 37/147 |

FOREIGN PATENT DOCUMENTS

| | | |
|---|---|---|
| DE | 198 02 409 A1 | 7/1999 |
| DE | 100 01 277 A1 | 7/2001 |
| DE | 101 59 454 A1 | 6/2003 |
| DE | 10 2006 017 686 A1 | 10/2007 |
| DE | 10 2008 035 297 A1 | 2/2009 |
| JP | 54-68150 A | 6/1979 |
| JP | 54-81597 A | 6/1979 |
| JP | 4-196100 A | 7/1992 |
| JP | 2008-153209 A | 7/2008 |
| JP | 2009-54581 A | 3/2009 |

OTHER PUBLICATIONS

Haider, M., et al., "Correction of the Spherical Aberration of a 200 kV TEM by Means of a Hexapole-Corrector", OPTIK 99, 1995, No. 4, pp. 167-179 (Thirteen (13) pages).

International Search Report (PCT/ISA/210) issued in PCT Application No. PCT/JP2014/062194 dated Jun. 3, 2014 with English translation (Two (2) pages).

* cited by examiner

CHARGED PARTICLE BEAM DEVICE

TECHNICAL FIELD

The present invention relates to an aberration correction method used for a charged particle beam device.

BACKGROUND ART

In a focused ion beam system (FIB), an electron beam lithography system (EB), and an electron microscope such as a scanning electron microscope (SEM), a transmission electron microscope (TEM), a scanning transmission electron microscope (STEM) using a charged particle beam, beam blur due to a chromatic aberration, a spherical aberration, and the like have become a limit of their resolution and processing accuracy. In conventional aberration correction techniques, complex multipole systems are used, and some are commercially available; however, they are expensive, and particularly for simultaneous correction of the chromatic aberration and the spherical aberration, highly advanced design and difficult adjustment have been required.

In JP 2009-054581 A, a method has been disclosed for forming a multipole field at low cost and having excellent controllability, which completely cancels a magnetic field on the axis using parallel current lines.

CITATION LIST

Patent Literature

PTL 1: JP 2009-054581 A

SUMMARY OF INVENTION

Technical Problem

A rotationally symmetric electron lens, which is simple in the design, manufacturing method, and adjustment method, has long been used for an electron optical device such as an electron microscope. On the other hand, a rotationally symmetric electron lens has only a convex lens function, and it has been proved that aberration is finite. Therefore, in a conventional aberration correction method, correction has been performed by arranging a plurality of rotationally asymmetric multipole system to final complex convergent and divergent fields. That is, in charged particle beam optics, by using multipole system, in addition to beam deflection, a line-focus and an astigmatism correction function, that is, a divergent field is locally possible, and it can be electrically controlled. In the conventional technique, from this feature, aberration correction has been achieved by a complex process in which the charged particle is alternately line-focused in the XY plane in the Z-axis direction of the trajectory, and is made to converge in one direction and is made to diverge in the other direction.

Generally, these multipole systems are configured by using a magnetic pole or an electrode equally divided in the rotation direction around the axis. The number of magnetic poles or electrodes is large and is 4-12, and accuracy is also required, so that they are expensive, including the power source; in particular, chromatic aberration correction and spherical aberration correction have been difficult, which requires exact trajectory adjustment.

Even by PTL 1, the complexity of the trajectory adjustment and configuration of the multipole field has not been basically resolved. That is, same as the conventional technique, the beam axis is a straight line and correction coils are arranged in series, and correction fields are arranged in multiple stages in the limited region and direction. Therefore, in addition to these configurations, it has been a complex beam trajectory to balance aberration cancellation.

On the other hand, for applications such as three-dimensional observation and crystal orientation observation, a multifunctional electron microscope capable of inclining a beam with little aberration has been required.

Solution to Problem

To meet such problems and market needs simultaneously, an aberration correction method has been devised that is capable of suppressing a chromatic aberration and a spherical aberration in an inclination beam.

The aberration is corrected by forming a local concave lens field with a multipole, parallel current lines, or the like, matching the beam axis with the local concave lens field via a conventional rotationally symmetric lens, deflector or astigmatism corrector, and counteracting an aberration occurring from another rotationally symmetric convex lens field. Thus, aberration correction is possible with a simple configuration and in the same principle as of the doublet and triplet configurations in optics.

That is, a charged particle beam device of the present invention includes: a charged particle source; a rotationally symmetric lens system through which a charged particle beam generated from the charged particle source passes; an electromagnetic field generating unit configured to generate N-fold symmetry electromagnetic field (N is a natural number of 2 or more) around the optical axis; and an entrance deflector arranged at the entrance side of the electromagnetic field generating unit and configured to deflect the charged particle beam, wherein an aberration of the charged particle beam due to the lens system is corrected by deflecting the charged particle beam passing through the lens system via the entrance deflector to make the charged particle beam to enter a local divergent field formed in an off-axis region of the N-fold symmetry electromagnetic field. An optical axis matches a rotational symmetry axis of a lens system, and a charged particle source is arranged on the optical axis.

A local divergent field in an off-axis region of an N-fold symmetry electromagnetic field can be formed with an electrostatic type multipole, a magnetic field type multipole or N parallel current lines arranged by angle division number N around the optical axis outside a space through which a charged particle beam passes.

When the local divergent field is formed in the off-axis region via the parallel current lines, the charged particle beam can be made to enter a range of a radius (R/3) from the center except for the center, where, as viewed in a plane perpendicular to the rotational symmetry axis of the lens system, the center is a position of the rotational symmetry axis, and R is a distance from the center to the parallel current lines.

In addition, when the local divergent field is formed in the off-axis region via the parallel current lines, it is suitable that the inside part of a toroidally wound coil is made to function as the parallel current lines, and the inside part of the toroidally wound coil is arranged inside a magnetic field shield, and the rest part of the toroidally wound coil is arranged outside the magnetic field shield.

The electromagnetic field generating unit can generate a 2-fold symmetry electromagnetic field and a 4-fold symmetry electromagnetic field such that the respective local divergent fields overlap with each other, and the charged particle beam can be made to enter the local divergent fields overlapping with each other.

As one aspect, the charged particle beam device can include two parallel current lines arranged by angle division number 2 around the optical axis for generating the 2-fold symmetry electromagnetic field, and four parallel current lines arranged by angle division number 4 around the optical axis for generating the 4-fold symmetry electromagnetic field outside a space through which the charged particle beam passes, and a chromatic aberration of the charged particle beam can be corrected by controlling magnitude of current flowing through the parallel current lines for generating the 2-fold symmetry electromagnetic field, and an aperture aberration of the charged particle beam can be corrected by controlling magnitude of current flowing through the parallel current lines for generating the 4-fold symmetry electromagnetic field.

An astigmatism corrector including two sets of parallel current lines of angle division number 2 arranged to be shifted 45 degrees from each other around the optical axis can be installed at the entrance side and exit side to the electromagnetic field generating unit.

The lens system can include a first lens arranged at the entrance side to the electromagnetic field generating unit, and a second lens arranged at the exit side to the electromagnetic field generating unit. The first lens and the second lens can be electrostatic lenses.

In addition, the astigmatism corrector can be arranged at each of the entrance side and the exit side of the electromagnetic field generating unit, and the two astigmatism correctors can be controlled in conjunction with each other. An exit deflector can be included at the exit side of the electromagnetic field generating unit.

The charged particle beam can be controlled such that the entrance angle and the exit angle become substantially symmetric to each other, while being made to be parallel to the optical axis at a substantially midpoint of the electromagnetic field generating unit via the entrance deflector, the exit deflector, and the electrostatic lens.

In addition, a charged particle beam device of the present invention includes: a charged particle source; a rotationally symmetric lens system through which a charged particle beam generated from the charged particle source passes; a correction coil unit configured to generate a local rotating magnetic field around the optical axis; and an entrance deflector arranged at the entrance side of the correction coil unit and configured to deflect the charged particle beam, wherein an aberration of the charged particle beam due to the lens system is corrected by deflecting the charged particle beam passing through the lens system via the entrance deflector to make the charged particle beam enter the local rotating magnetic field formed with the correction coil unit.

A correction coil unit can include two sets of toroidally wound coils radially arranged from the optical axis, and the toroidally wound coil can have a trapezoidal shape whose upper side and lower side are parallel to the optical axis and the length of the lower side far from the optical axis is longer than the length of the upper side near the optical axis, and a local rotating magnetic field can be generated in a space sandwiched by the two sets of toroidally wound coils with parallel current lines configured by the upper side and the lower side.

A reverse current coil can be arranged that is close to the side connecting the upper side and the lower side of the trapezoidal shaped toroidally wound coil to cancel a magnetic field generated by the current flowing through the side.

Advantageous Effects of Invention

According to the present invention, a multifunctional charged particle optical system can be achieved while the conventional complexity is avoided. Specifically, the following effects can be expected.

For one thing, an aberration corrector can be achieved at low cost and less components. For forming a local divergent field, a multipole or a parallel current system is used. In particular, the parallel current system has no magnetic saturation or hysteresis, and is linear, and a field can be built that can be calculated by the number of turns and arrangement. In addition, analysis is easy, and combined design and adjustment of an optical lens style become possible. Further, the coil can be taken out to the outside of the vacuum and maintenance is easy, and power source can be saved by current connection and cost reduction is possible.

In addition, by beam off-axis adjustment that is an additional effect, consequently, a beam inclination system of no aberration can be achieved. When the present invention is applied to a scanning electron microscope (SEM) and a transmission electron microscope (TEM), stereo observation of the inside and surface, and high speed and high resolution observation of the crystal orientation and the like can be achieved in each microscope. For problems, configurations, and effects other than those described above become apparent from the following description of embodiments.

DESCRIPTION OF EMBODIMENTS

A large difference between a charged particle beam device and an optical device is their opening angle (numerical aperture); the numerical aperture of the charged particle beam is an order of 10 mrad since the aberration is large, and is very small in comparison with the numerical aperture of the optical lens. From this feature, by adding astigmatism function to a rotationally symmetric lens for line-focusing in the direction of a local divergent field, the beam can be localized. That is, in the present invention, aberration correction can be achieved simultaneously with beam inclination by locally forming a divergent field in the off-axis region with a multipole, matching the beam trajectory with the off-axis local divergent field by combining a deflector and an astigmatism corrector with the rotationally symmetric lens.

Specifically, when the magnetic field type octopole is used, a third-order magnetic field $B_3$ and a convergent and divergent magnetic field $B_1$ being also an astigmatism correction field of a quadrupole can be generated. In addition, an electrostatic type octopole can generate the same function. Further, instead of these multipoles, by using parallel current lines, a high controllability corrector having no hysteresis can be achieved at low cost.

Here, in the XY plane of the XYZ coordinate system (right-handed system), where the Z-axis is the optical axis of the charged particle optical system, a circle of a radius R is set around the origin, and n parallel current lines extending in the Z direction are arranged at n positions equally dividing the circumference into n. Currents of the same magnitude flow through the n parallel current lines in the same direction. The correction coil configured by the n parallel current lines arranged by angle division number n around the optical axis is herein after referred to as "N=n system correction coil" of the radius R.

Figure 1:
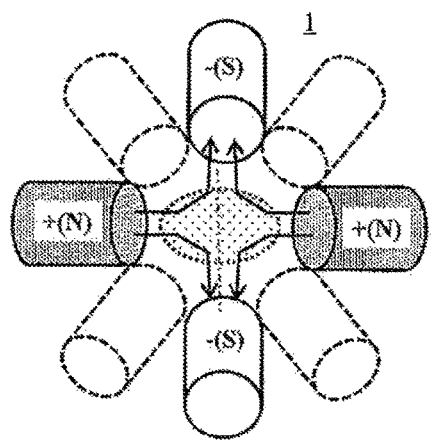
FIG. 1 is an explanatory diagram of a magnetic field with a multipole.
Figure 2:
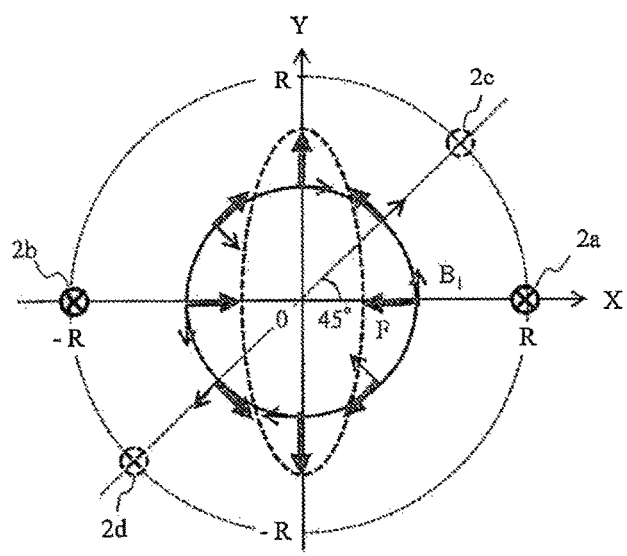
FIG. 2 is an explanatory diagram of a function and a magnetic field by parallel current lines.

FIG. 1 is an explanatory diagram of a 2-fold symmetry magnetic field by a multipole, and FIG. 2 is an explanatory diagram of a function and a 2-fold symmetry magnetic field generated by an N=2 system correction coil of the radius R. The correction coil illustrated in FIG. 2 is configured by two parallel current lines 2a, 2b arranged at positions (−R, 0) and (R, 0) on the X-Y coordinates outside a space through which the charged particle beam passes and extending in parallel to the Z-axis going toward the front surface from the back surface perpendicular to the paper surface. In the example of the figure, the currents of the same magnitude flow through the two parallel current lines 2a, 2b from the front to the back of the paper.

As illustrated in FIG. 1, in a multipole 1, an on-axis field is canceled by symmetric fields alternately inverting between positive and negative; however, as illustrated in FIG. 2, in the pair of parallel current lines 2a, 2b, an on-axis magnetic field is automatically canceled by using rotation of the magnetic field. As a result, in the example of FIG. 2, from the axis, a convex lens field in the X-axis direction and a concave lens field in the Y-axis direction are locally generated. Where a charged particle has a positive charge, and flies in the Z-axis direction.

Further, it can be seen that, as illustrated in FIG. 2, in addition to an N=2 system first correction coil of the radius R configured by the pair of parallel current lines 2a, 2b, when an N=2 system second correction coil of the radius R configured by another pair of parallel current lines 2c, 2d is provided at a position rotated 45 degrees around the origin to the first correction coil, an astigmatism correction function can be generated in a desired direction, and astigmatism correction in any direction becomes possible at low cost. That is, generally, in the multipole illustrated in FIG. 1, an astigmatism function in an oblique direction is generated by the quadrupole rotated 45 degrees indicated by the dashed line; however, in the correction coil system, an equivalent function can be achieved by independently controlling the currents flowing through the N=2 system first correction coils 2a, 2b and the currents flowing through the N=2 system second correction coils 2c, 2d arranged at the position rotated 45 degrees from the first correction coil.

Here, a space range available as the concave lens field is determined by the amount of focusing function that is orthogonal to off-axis dependence of the amount of divergent function. That is, when it is an ideal concave lens, the off-axis dependence is linear, and in a case of a correction field corresponding to so-called aspherical surface, it becomes a cubic equation. In addition, the focusing function can be relatively decreased depending on the amount of off-axis by separating the beam from the axis in a concave lens function direction. Therefore, in a specific embodiment, a desired amount of off-axis can be calculated, and as described later, roughly, a transmission range of the beam can be a range within a radius (R/3) centered at the point (0, 0) on the central axis (that is, a diameter centered at the point (0, 0) is within a range of ⅓ of the distance between the pair of parallel current lines), and a range except for the point (0, 0) on the central axis. Since magnetic field intensity can be regarded to linearly change according to an increase of the distance from the center (0, 0) in the range within the radius (R/3) centered at the point (0, 0), when it is within the region, the range becomes available as the local concave lens field by calculating the amount of deflection of the beam based on the magnetic field intensity in each point. More preferably, the beam should pass through on an axis (Y-axis in FIG. 2) in a direction perpendicular to an axis (X-axis in FIG. 2) connecting the pair of parallel current lines or in the vicinity thereof, within the range of the radius (R/3) centered at the point (0, 0) on the central axis. This is because, in the axis or the vicinity thereof, the magnetic field is not generated or very small in a direction for rotating the beam itself. Incidentally, when the rotation function of the beam itself is considered, the range other than that on the axis is available when being within the radius (R/3) centered at the point (0, 0). In addition, here, an example has been described in which the current flows in the direction illustrated in FIG. 2; however, when the current flows through each of the parallel current lines in the opposite direction to that of FIG. 2, a direction of force acting on the beam becomes opposite to the arrow illustrated in FIG. 2, so that the region becomes available as the concave lens on the axis (X-axis in FIG. 2) connecting the pair of parallel current lines and in the vicinity thereof. Here, "vicinity" means the amount that allows the size of the beam and the error of the amount of deflection, and the range in which the magnetic field can be regarded to be substantially zero in the direction for rotating the beam itself.

In addition, as described above, when being within the range of the radius (R/3) centered at the point (0, 0), the magnetic field is linearly intensified according to the amount of off-axis from the center (0, 0), so that the amount of off-axis can be determined depending on the amount of aberration correction to be required. For example, when the beam is required to be largely changed, it can be largely separated from the point (0, 0), and when a small change is required, a region close to the point (0, 0) can be used.

Figure 3:
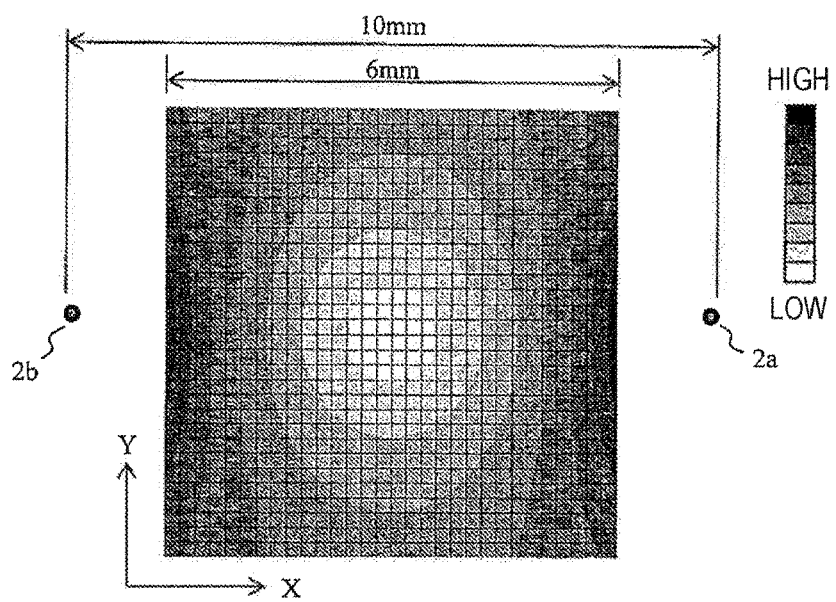
FIG. 3 is a shaded view illustrating magnetic field intensity generated by a pair of parallel current lines.
Figure 4:
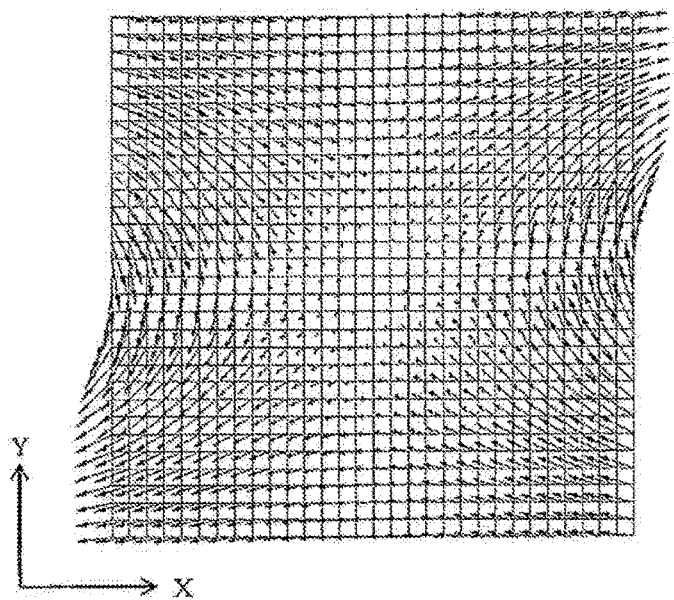
FIG. 4 is a diagram illustrating a direction and intensity of the magnetic field at each lattice point obtained by dividing a region into lattice shapes.

A reason is described below why the region available as the local divergent field is in a range within the radius (R/3) centered at the point (0, 0). FIG. 3 is a diagram representing the magnetic field intensity in light and shade by analyzing the magnetic field generated by the pair of parallel current lines 2a, 2b arranged to be separated 10 mm from each other. In this case, R=5 mm. FIG. 4 is a diagram illustrating the intensity and direction of the magnetic field with arrows at each lattice point obtained by dividing the region into the lattice shapes. The length of the arrow represents the intensity of the magnetic field, and the direction of the arrow represents the direction of the magnetic field. FIG. 3 and FIG. 4, as illustrated in FIG. 3, each illustrate a magnetic field distribution of the region of vertically and horizontally 6 mm centered at the point (0, 0) being a midpoint of the line connecting the pair of parallel current lines 2a, 2b. The length of the coil extending in the Z-axis direction is 40 mm. It can be seen that the magnetic field intensity is low at the midpoint of the line connecting the pair of parallel current lines, that is, near the point (0, 0), and the magnetic field intensity is high in the region close to the parallel current lines 2a, 2b.

Figure 5:
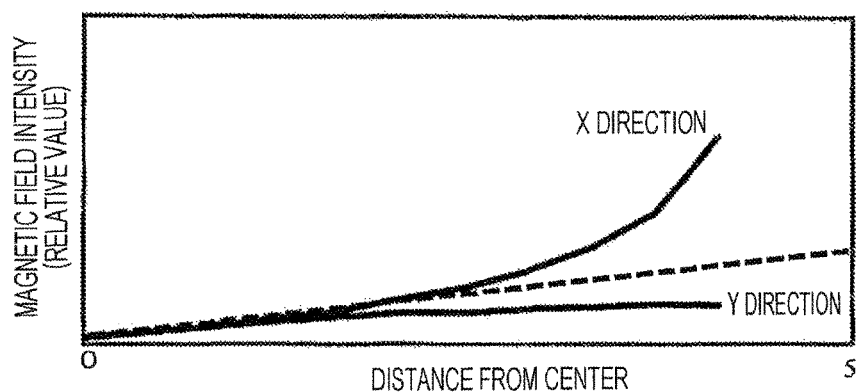
FIG. 5 is a diagram illustrating a relationship between a distance from the center and magnetic field intensity.

FIG. 5 is a diagram illustrating a relationship between the distance from the point (0, 0) and the magnetic field intensity. In the figure, the magnetic field intensity on the X-axis and the magnetic field intensity on the Y-axis passing through the point (0, 0) are illustrated as X direction, Y direction, respectively. As can be seen from FIG. 5, the magnetic field intensity linearly changes until a distance of about (R/3) from the central point (0, 0), however, lose the linearity in a distance more distant than that. The range in which the magnetic field intensity linearly changes is the range in which the deflection function of the beam can be controlled, and the linearity of the magnetic field is kept in the range of the radius (R/3) centered at the point (0, 0), so that the region that can be used for the aberration correction is the range of the radius (R/3) centered at the point (0, 0).

Figure 6:
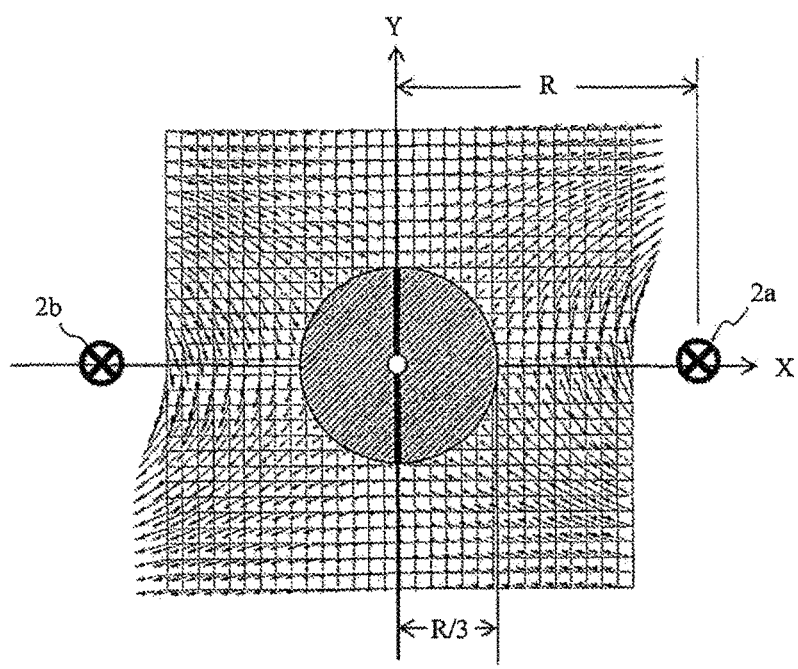
FIG. 6 is a diagram illustrating a region available as a local divergent field.

FIG. 6 is a diagram illustrating the region available as the local divergent field. As described above, the region available as the local divergent field for the aberration correction is the region indicated by hatching in FIG. 6, that is, the range of the radius (R/3) centered at the point (0, 0) except for the point (0, 0). A particularly effective region among them is the region on the Y-axis indicated with a thick black line in the figure and in the vicinity thereof. Since the region separated from the Y-axis also functions as the divergent field, the beam form can be changed; however, the rotation function simultaneously functions, so that the region on the Y-axis and the vicinity thereof is optimal when the control is considered. Where the beam passes through in the region on the Y-axis indicated with the thick black line and in the vicinity thereof can be selected depending on the amount of aberration correction to be required. The magnetic field is intensified as being separated from the center (0, 0) to the outside, so that the beam form can be largely changed.

Incidentally, when the direction is reversed of the current flowing through the parallel current lines 2a, 2b, the direction is reversed of the force described in FIG. 2, so that the X-axis direction can be used for the local divergent field. That is, the region (direction) that can be used for the local divergent field is changed depending on the direction of the current flowing through the parallel current lines. However, in any case, in the outside of the region indicated by hatching, linearity of the magnetic field cannot be kept, so that utilization for the aberration correction becomes difficult.

Figure 7:
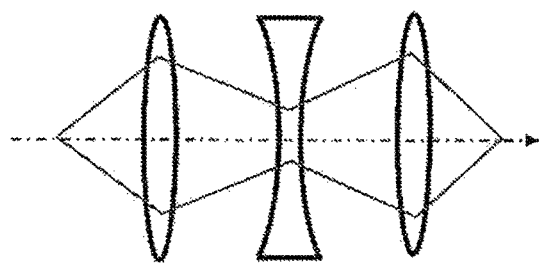
FIG. 7 is an explanatory diagram of aberration correction by a triplet lens.

In the optical lens, lens medium inherent chromatic dispersion and aberrations are corrected by using a doublet or a triplet being concave and convex combination lens, or making the lens surface aspherical. FIG. 7 is a schematic diagram illustrating a triplet lens in which a concave lens used in optical aberration correction is sandwiched by two convex lenses. Here, a chromatic aberration is corrected by utilizing that chromatic dispersion of the central concave lens becomes opposite to those of the convex lenses, and for correction of geometric aberration, the aspherical lens is used.

Figure 8:
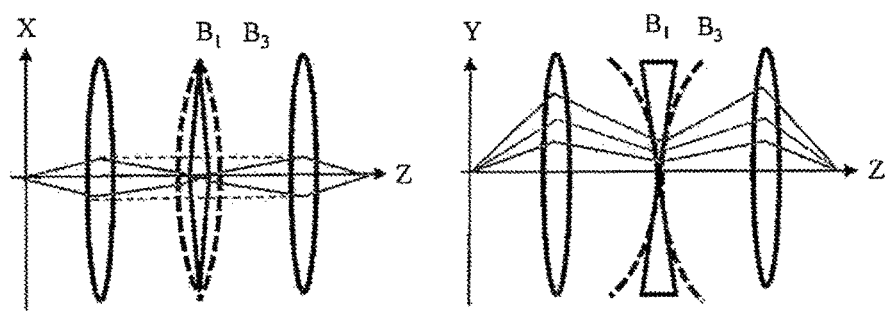
FIG. 8 is a schematic diagram illustrating an aberration correction concept of the present invention.

FIG. 8 is a schematic diagram illustrating an aberration correction concept of the present invention, to the triplet in FIG. 7. The right figure of FIG. 8 is a diagram in the YZ plane, and the left figure is a diagram in the XZ plane. As illustrated in the right figure of FIG. 8, a multipole is arranged as the concave lens at the center in the Y-axis direction, and rotationally symmetric lenses are arranged at the entrance side and the exit side. Here, a concave lens function in the Y-axis direction, that is, a divergent function becomes stronger proportional to the amount of off-axis (y-coordinate value). On the other hand, in the X-axis direction illustrated in the left figure of FIG. 8, a weak focusing field corresponding to the on-axis (x=0) is generated, and shows a convex lens function. When the range is wide in which the divergent field is strong and the focusing field is weak, the beam trajectory is made to be the straight line illustrated with a dotted line in the left figure of FIG. 8, and when the range is narrow, for example, a convex lens aberration can be suppressed by line-crossing the beam trajectory in the astigmatism correction.

Here, when the range in the rotation direction of the divergent field is narrow and the distortion is large, the concave lens function can be received only in the radial direction by arranging the astigmatism correctors at the entrance and exit sides and by line-focusing the beam in the rotation direction to restore. The aberration in the rotation direction can be canceled by the front and rear rotationally symmetric lenses and symmetry of the trajectory cross by the astigmatism correction. That is, rotational symmetry is effective for aberration suppression in the rotation direction, and correction elements can be reduced. The correction principle is described below with a correction coil field configured by the parallel current lines that are easy to be analyzed.

A magnetic field $Br$ of a rotationally symmetric system, by differential of the on-axis magnetic field $Bz$, can be expanded as follows by Taylor expansion. Although the magnetic field is described as an example below, an electric field can be expanded similarly.

$$Br=(1/2)Bz'r-(1/16)Bz''r^3+(1/384)Bz'''r^4+\cdots$$

For example, a third term and later that make the magnetic field Br non-linear, in particular the third term proportional to the amount of off-axis $r^3$ becomes a problem as a third-order spherical aberration. Hereinafter, it is described that a first-order field necessary to chromatic dispersion correction and a third-order field necessary to aperture aberration correction can be formed with combination of the correction coils using the parallel current lines.

First, calculation formulas of a magnetic field $B_{2w}$ in the parallel current $I_1$ direction near the axis of the N=2 system correction coil of the radius R and a magnetic field $B_{2s}$ in the gap direction are as follows, where a distance from the origin to a beam passing position, that is, a trajectory diameter is r.

$$B_{2w}(r)=\mu_0(I_1/\pi)r/(R^2-r^2)$$

$$B_{2s}(r)=\mu_0(I_1/\pi)r/(R^2+r^2)$$

Here, when r<<R, first-order magnetic field $B_1$ becomes $$B_1=\mu_0(I_1/\pi)r/R^2$$

and, by using acceleration voltage V, mass m, electric charge e, a deflection sensitivity $\alpha_1$ becomes $$\alpha_1=B_1/(2mV/e)^{0.5}=\mu_0(I_1/\pi)r/R^2/(2mV/e)^{0.5}$$

Here, an amount of deflection $y_s$ can be calculated by using coil length 2l, deflection length L with the following formula.

$$y_s=2lL\alpha_1$$

Further, in the N=2 system correction coil, in addition to the above-described $B_1$, the following $B_3$ also exists.

$$B_3=\mu_0(I_1/\pi)r^3/R^4$$

Therefore, in the N=2 system correction coil, a ratio between the first-order magnetic field and the third-order magnetic field becomes as follows.

$$B_3/B_1=r^2/R^2$$

The radius R is a distance from the origin to the parallel current of the coil, and is a parameter defined by arrangement of the coil, and is fixed when the aberration corrector is arranged in the optical system. Therefore, in the range in which approximation of r<<R is satisfied in the N=2 system correction coil, the ratio between the first-order magnetic field and the third-order magnetic field can be easily controlled only by adjusting the distance r from the origin to the beam passing position. For example, when the beam is made to pass through the range of the radius (R/3) centered at the point (0, 0) as described above (that is, r<(R/3)), since the third-order magnetic field can be regarded to be sufficiently smaller than the first-order magnetic field, the aberration of the beam can be easily controlled only by considering the first-order magnetic field.

Next, a case is considered of using an N=4 system correction coil of the radius R. When parallel current $I_3$ flows through two coils newly added to the N=2 system and parallel current of $I_1+I_3$ flows through the other two coils, the first-order magnetic field $B_1$ can be canceled by adjusting $I_3$. The third-order magnetic field $B_3$ being a term of the lowest order generated at this time, when r<<R, is as follows.

$$B_3=\mu_0(2I_3/\pi)r^3/R^4$$

A deflection sensitivity $\alpha_3$ is as follows.

$$\alpha_3=B_3/(2mV/e)^{0.5}=\mu_0(2I_3/\pi)r^3/R^4/(2mV/e)^{0.5}$$

In these fields, since convergent and divergent fields can be controlled by the direction of current, it is apparent that, when $I_1$ and $I_3$ are adjusted and magnetic fields respectively made by $I_1$ and $I_3$ are added in the system of parallel current lines number N=4, the corresponding first-order magnetic field $B_1$ and third-order magnetic field $B_3$ can be independently controlled.

Figure 9:
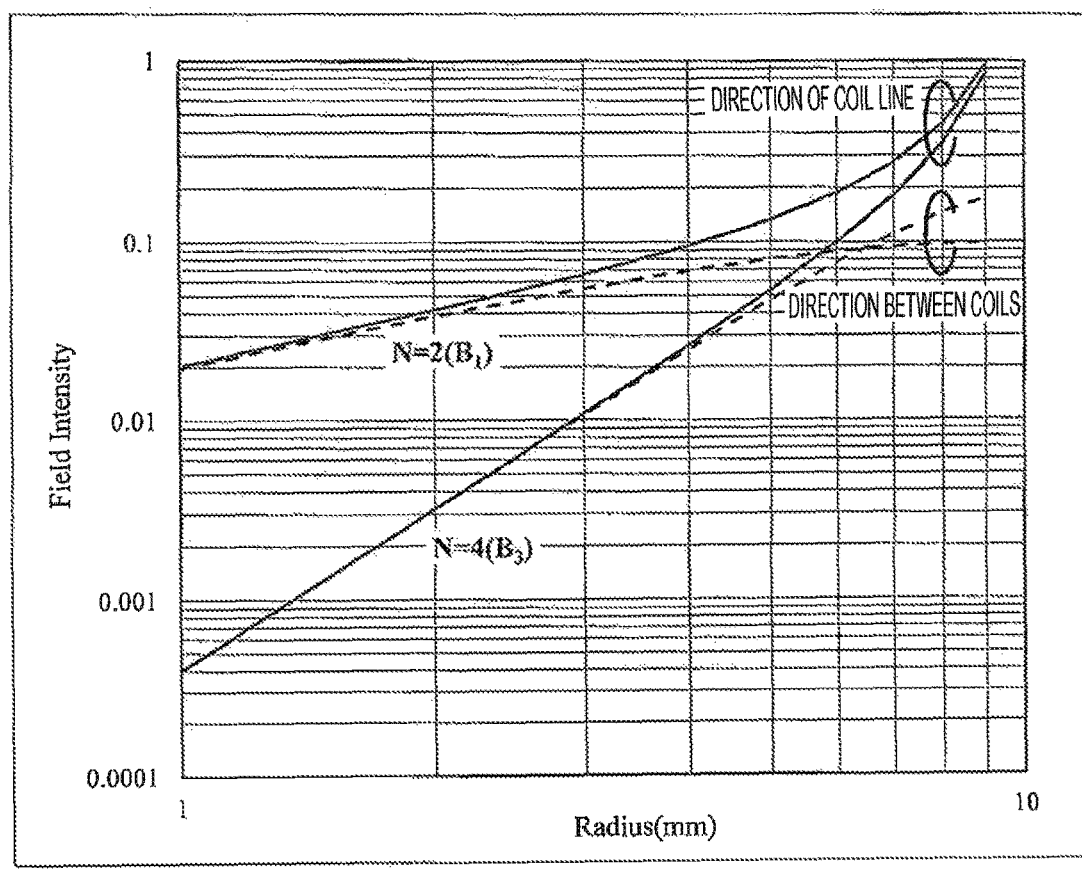
FIG. 9 is a diagram illustrating a calculation example of a magnetic field intensity distribution by the parallel current lines.

An exact calculation example of the magnetic field is illustrated anew in FIG. 9. FIG. 9 is a calculation result of magnetic field intensity in a direction connecting the parallel current lines facing with each other (direction of coil line), and in a direction dividing the angle into two between the adjacent parallel current lines (direction between coils), to the N=2 system correction coil of the radius R and the N=4 system correction coil. In FIG. 9, the radius R=10 mm, and distance r dependence from the axis of the magnetic field intensity is illustrated; the magnetic field intensity in the direction of coil line and the magnetic field intensity in the direction between coils are displayed inverted to see the degree of matching in the near-axis region.

In the near-axis region (r=0-2 mm) in which r is actually small, the N=2 system can be linearly approximated, and the N=4 system can be approximated by a cubic expression. In addition, in the direction of coil line, it asymptotically converges to a single coil field. As described above, electromagnetic field analysis is required generally in the electromagnetic multipole; however, in the N=n system correction coil, analytical evaluation is possible of the concave and convex lens functions described in FIG. 2.

In more detail, from FIG. 9, high-order terms are different between a magnetic field $B_{2w}$ in the direction of coil line of the N=2 system correction coil and a magnetic field $B_{2s}$ in the direction between coils. This is the point in which a rotation cancellation field of the parallel current and a conventional symmetrically divided multipole field are different from each other, and it has gradually increasing and gradually decreasing characteristics of the high-order field depending on the direction to the parallel current lines. Generally, in the rotationally symmetric system to be a target of the aberration correction, high-order field is gradually increasing in off-axis. In particular, $B_{2w}$ has a characteristic in which the high-order field increases asymptotically to a current $I_1$ single line field. When the intensity of the high-order field is selected by trajectory adjustment with the N=2 system correction coil, the aberration can be suppressed at extremely low cost.

Figure 10:
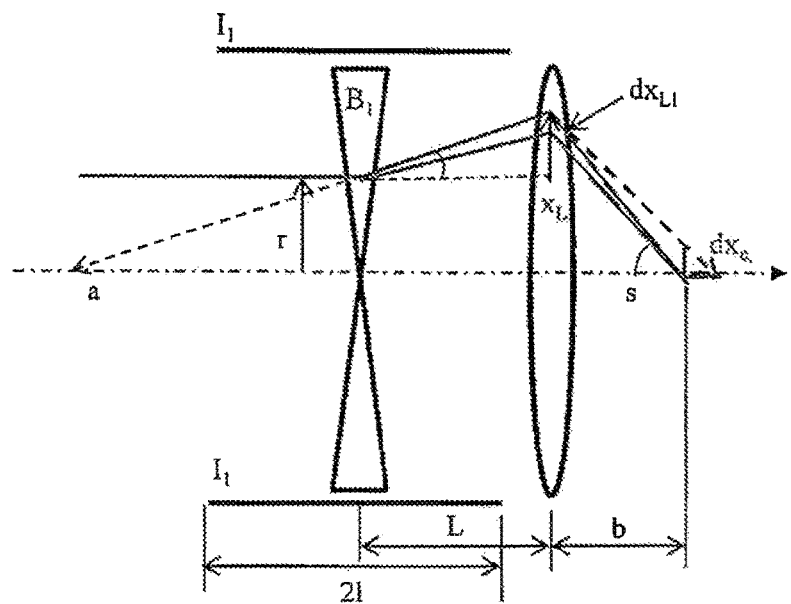
FIG. 10 is a conceptual diagram of an aberration correction with a doublet configuration.
Figure 11:
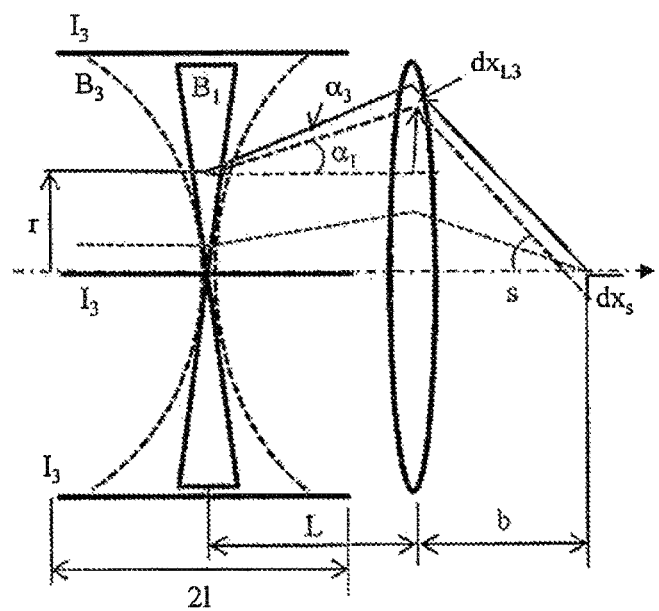
FIG. 11 is a conceptual diagram of an aberration correction with the doublet configuration.

In FIG. 10 and FIG. 11, a principle and a calculation example is illustrated of the aberration correction with a doublet system configured by a correction coil using the parallel current lines described above and a rotationally symmetric lens. In FIG. 10 and FIG. 11, the N=2 system correction coil (current $I_1$) and the N=4 system correction coil (current $I_3$) of length 2l are arranged at distance L in the front stage of the convex lens of focal length f, imaging distance b, and the first-order and the third-order concave lens magnetic fields $B_1$, $B_3$ are generated that are schematically illustrated by the straight line (triangle) and the curved line respectively. The beam trajectory enters parallel to the axis with the amount of off-axis r.

First, the chromatic aberration is corrected according to FIG. 10 as follows. A deflection distance $x_L$ by the divergent function $\alpha_1$ of the N=2 system correction coil is $$x_L=2lL\alpha_1$$

and, with noting the direction of the divergent lens, the chromatic aberration $dx_L$ becomes $$dx_L = -2lL\alpha_1(dV/2V).$$

From a chromatic aberration coefficient $C_c$, an amount of chromatic aberration $dx_c$ of the rotationally symmetric lens becomes $$dx_c = C_c(dV/V)(r+x_L)/b.$$

From a correction condition $dx_L + dx_c = 0$ of the chromatic aberration at the imaging distance b, $$lL\alpha_1 + C_c(r+2lL\alpha_1)/b = 0$$

and, when $k = \mu_0/\pi(2m/e)^{0.5}$, the coil current $I_1$ becomes $$I_1 = -C_c R^2 V^{0.5}/(2C_c+b)lLk.$$

Here, $$C_c/(2C_c+b) = 1/\{2+(b/C_c)\}$$

and, $b/C_c$ is in a proportional relationship and becomes substantially constant. Therefore, it can be seen that the current $I_1$ becomes a constant value without depending on the trajectory condition when the rear stage lens is determined. This corresponds to that lens achromatism does not depend on any object point and image point, and the focusing trajectory.

Similarly, in FIG. 11, an aperture aberration $dx_{L3}$ by the divergent function $\alpha_3$ of the N=4 system correction coil is $$dx_{L3} = 2lL\alpha_3$$

and, when $\alpha_3$ is a very small amount, from an aperture aberration coefficient $C_s$ of the rotationally symmetric lens, an amount of aperture aberration $dx_s$ becomes as follows.

$$dx_s = C_s\{(r+x_L)/b\}^3$$

From a correction condition $dx_{L3} + dx_s = 0$ of the aperture aberration, when $$2lL\alpha_3 + C_s\{(r+x_L)/b\}^3 = 0$$

is solved, the correction current $I_3$ can be calculated by $$I_3 = C_s(V^{0.5}R^2 + 2lLkI_1)^3/4lLkVb^3R^2.$$

By the above, it has been demonstrated that the desired chromatic aberration correction current $I_1$ and aperture aberration correction current $I_3$ are determined.

In these fields, as an independent element, vector addition is possible, and, by synthesizing the excitation current of the N=4 system correction coil, the N=2 system correction coil can be configured. In addition, for generation of further high-order field, for example, with an N=6 system correction coil, fifth-order convergent and divergent fields can be formed. Here, the high-order terms equal to or higher than third-order can be used for correcting high-order aperture aberration and adjusting high-order components associated with the N=2 system correction coil described in FIG. 9. The above is a simple estimation, and a point that exact analysis calculation can be performed becomes a major benefit for the design and adjustment.

Specifically, in FIG. 11, the off-axis direction of the beam matches the direction of the current $I_1$, and in the perpendicular direction, the coil (parallel current lines) is arranged for current $I_3$. That is, it is sufficient when $I_1 + I_3$ flow through the coil in the off-axis direction, and $I_3$ flows through the coil of two lines in the perpendicular direction. Thus, only four systems of coil and two systems of power source are required.

Here, in the case of the triplet system illustrated in FIG. 8, since the rotationally symmetric lenses are arranged symmetrically to the correction coil, the amount of function of the correction coil can be set to be doubled, that is, currents $I_1$, $I_3$ can be set to be twice as much as the above calculated value.

The above discussion, for the electrostatic type multipole or the magnetic field type multipole that generates an N-fold symmetry electromagnetic field, generally cannot be analytically solved, and requires electromagnetic field numerical calculation, however, is similarly applicable. That is, the beam can be made to enter the off-axis region in the direction of the divergent function from the electromagnetic field distribution calculated according to FIG. 10, FIG. 11.

Embodiment

Figure 12:
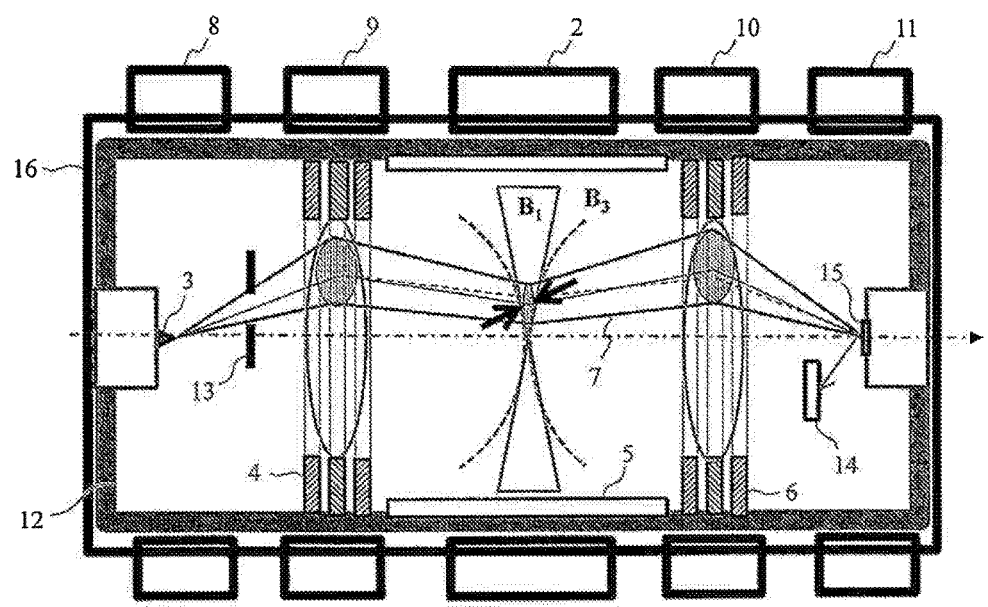
FIG. 12 is a schematic diagram illustrating an embodiment of a charged particle beam device configured to correct aberration with an electrical triplet configuration.

FIG. 12 is a schematic cross-sectional view illustrating an embodiment of a charged particle beam device configured to correct aberration with an electrical triplet configuration. In the embodiment illustrated in FIG. 12, an example is illustrated of using an electrostatic lens as a rotationally symmetric lens, which is low cost and space saving and has high controllability since there is no trajectory rotation function unlike the magnetic field lens. Further, in FIG. 12, in addition to an optical system for reducing an electron source diameter and a diaphragm 13 for determining a beam opening angle, a detection system 14 is included for observation of a sample 15. In particular, the diaphragm 13 facilitates trajectory adjustment by being mobilized or being provided with multiple openings to be selected by a deflector. In addition, a case of the electron beam is described below; however, it is the same in a case of the ion beam.

An electron beam 7 from an electron source 3 takes a symmetric trajectory centered at a correction coil 2 configured by an N=2 system and an N=4 system for forming divergent fields $B_1$, $B_3$, with an electrostatic lens 4. An entrance deflector 8 separates the beam 7 from the axis, and an exit angle to the sample 15 is adjusted by an exit deflector 11. An entrance astigmatism corrector 9 line-focuses the beam 7 in a divergent direction illustrated with arrows in the center of FIG. 12, at the center of the correction coil 2. Here, the symmetric arrangement to the central plane of the correction coil 2 is effective to cancel unnecessary aberration.

In the present configuration, procedures of the aberration correction are, for example, performed as follows.

(1) The electron beam 7 from the electron source 3 is imaged on the sample 15 by exciting the entrance electrostatic lens 4 and exit electrostatic lens 6 by the same amount simultaneously. The imaging condition is confirmed by a two-dimensional image or a line scanning waveform by adding a scanning signal to the correction coil 2.

(2) The entrance astigmatism corrector 9 and exit astigmatism corrector 10 are excited by the same amount simultaneously, and best imaging point of the signal of the sample 15 is searched again. That is, from the symmetry, the best imaging point is line-focused at the optical system center.

(3) The correction coil 2 is excited, and it is confirmed that a desired astigmatism function is generated in the scanning image of the sample 15. For example, the focus position is shifted by the exit electrostatic lens 6, and it can be confirmed, from the sensitivity, by so-called astigmatic difference.

(4) Further, the beam is deflected by the entrance deflector 8 and exit deflector 11 to the desired beam trajectory. Here, it is confirmed that functions of the entrance deflector 8 and exit deflector 11 are balanced, and the image of the sample 15 does not move.

(5) The aberration, that is, image blur of the sample 15 is minimized by fine adjustment of the correction coil 2, entrance deflector 8 and exit deflector 11, entrance astigmatism corrector 9 and exit astigmatism corrector 10. For example, the image can be confirmed by changing the acceleration voltage for the chromatic aberration, and by opening the diaphragm for the aperture aberration.

Strictly speaking, at the stage of fine adjustment, the chromatic aberration due to the entrance electrostatic lens 4 and entrance astigmatism corrector 9 affects the trajectory setting of the subsequent stage, and, in the perfect symmetric system, the aberration may become apparent. In that case, when the line-focus position of the correction coil 2 is adjusted forward and backward with the entrance astigmatism corrector 9, the aberration can be canceled by original balance of the astigmatism function of the correction coil illustrated in FIG. 8.

In the embodiment illustrated in FIG. 12, the correction coil 2 can be installed outside a vacuum chamber 12, and does not adversely affect the vacuum. In addition, a coil group can have structure that can be mechanically rotated and moved upward and downward outside the vacuum chamber 12. Structurally, coil winding method is toroidal winding, and the current line near the beam side generates the deflection function. At this time, influence of the outside winding, including noise, can be suppressed while keeping the symmetry by arranging a magnetic field shield 16 inside the outside winding and outside the inside winding. That is, as schematically illustrated in FIG. 12, the inside part of a toroidally wound coil functioning as parallel current lines is arranged inside the magnetic field shield 16, and the rest part of the toroidally wound coil is arranged outside the magnetic field shield 16. In addition, a decelerating electrode 5 is arranged to enhance the sensitivity of the divergent function of the correction coil 2. Thus, chromatic dispersion can be excited with less coil current.

The configuration of FIG. 12, when the entrance electrostatic lens 4 and the exit electrostatic lens 6 are grounded and the decelerating electrode 5 is regarded as a lens electrode, is a single pole electrostatic lens (einzel lens). An embodiment is described in FIG. 13 of the charged particle beam device in which the present invention is applied to a practical deceleration type einzel lens. Structurally, the charged particle beam device of FIG. 13, although it is similar to the charged particle beam device of FIG. 12, is simpler in configuration, and further, the cost can be reduced. That is, in the device illustrated in FIG. 13, the beam 7 emitted from the electron source 3 is separated from the axis by the entrance deflector 8, and divergent focusing function of the beam 7 in the correction coil 2 is adjusted by the entrance astigmatism corrector 9, and the chromatic dispersion is suppressed by the divergent field of the correction coil 2, and the remaining astigmatism aberration is modified by the exit astigmatism corrector 10, and the beam 7 is emitted to the sample 15. Here, when the trajectory is vertically (in two directions) reversed with the entrance deflector 8 as indicated by the solid line and dotted line, stereoscopic view becomes possible to the sample 15.

Figure 13:
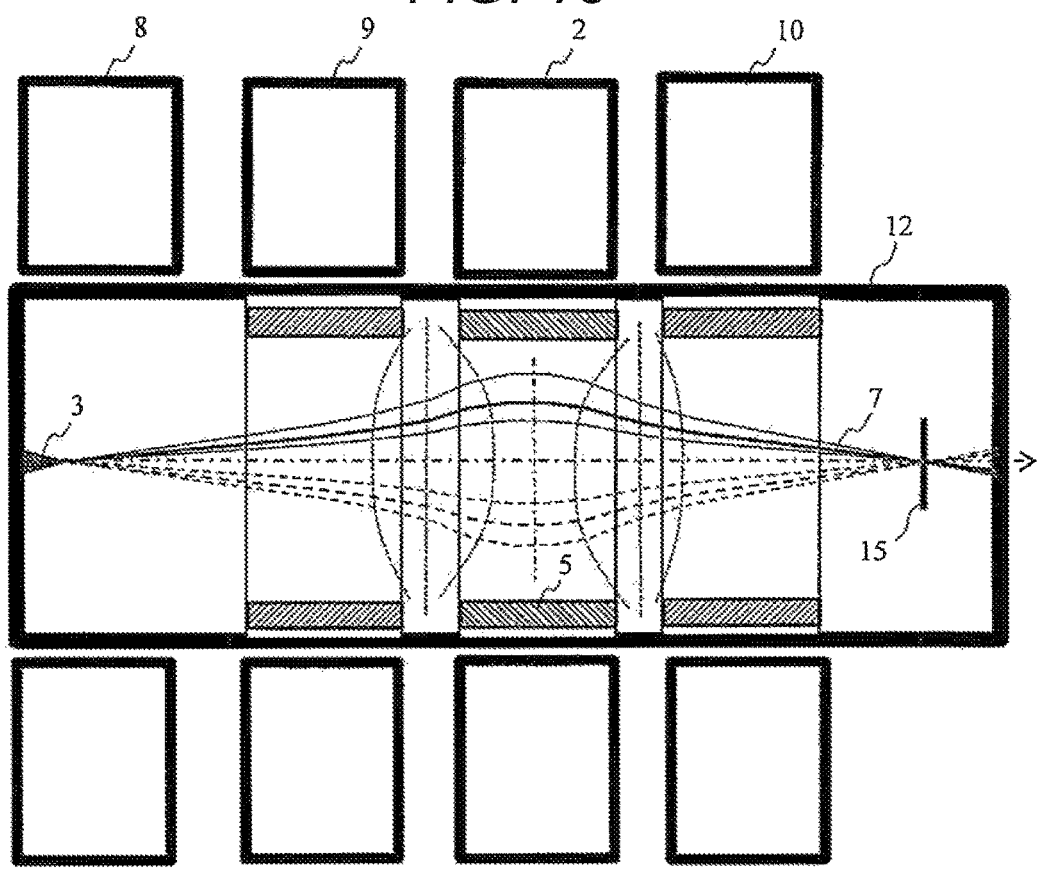
FIG. 13 is a schematic diagram illustrating an embodiment of a charged particle beam device configured to perform aberration correction by including a deceleration type electrostatic lens.

In the deceleration type einzel lens of FIG. 13, the trajectory of the beam 7 automatically bulges outward at the center due to deceleration, and becomes a parallel trajectory at the lens center. This is the cause of that the aberration of the deceleration type electrostatic lens is generally large; however, when it is used for the present configuration, the sensitivity of the correction coil 2 is enhanced. When the electrostatic focusing function and the magnetic field divergent function are balanced at the lens center, the beam travels straight. Here, when energy is increased, the deflection sensitivity is increased due to the magnetic field function proportional to the velocity of the charged particle. This is opposite to the chromatic dispersion of the conventional rotationally symmetric lens, and as a result, the chromatic aberration can be corrected. This is a similar effect to the chromatic aberration correction using so-called Wien filter.

Figure 14:
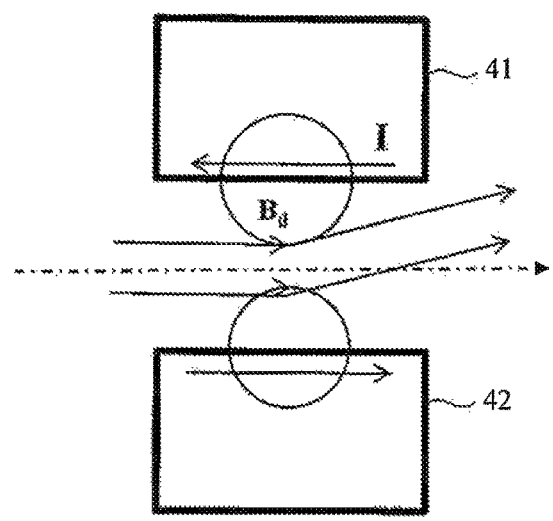
FIG. 14 is an explanatory diagram of a deflection function of a toroidal coil.
Figure 15:
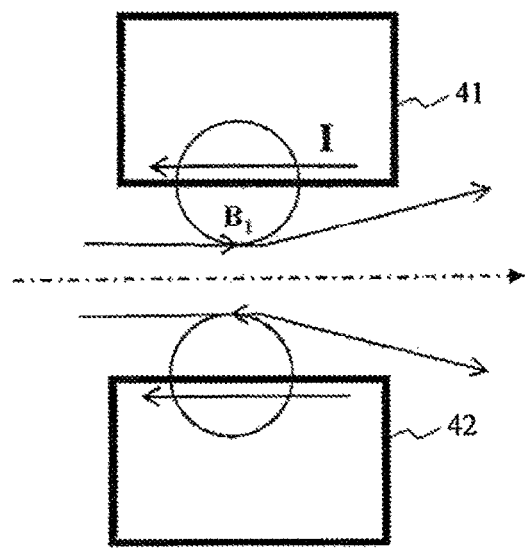
FIG. 15 is an explanatory diagram of a divergent function of the toroidal coil.
Figure 16:
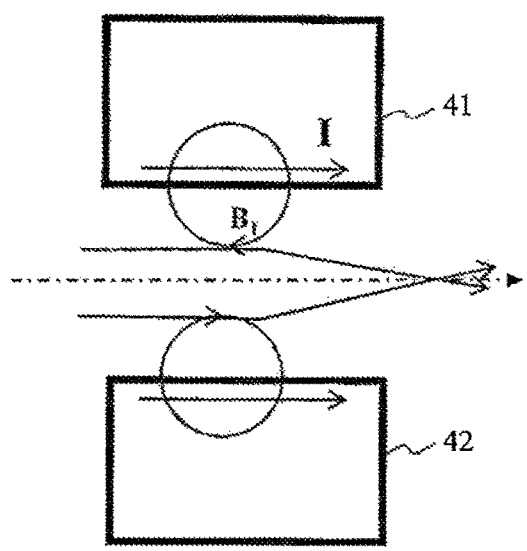
FIG. 16 is an explanatory diagram of a convergent function of the toroidal coil.

The characteristics of the toroidally wound coil are schematically illustrated in FIGS. 14-16. Depending on the direction of current I, a beam deflector of FIG. 14, a beam divergent function illustrated in FIG. 15, a beam convergent function illustrated in FIG. 16 can be obtained. That is, as illustrated in FIG. 14, when the directions of the current flowing through the side close to the beam of the coils 41, 42 facing with each other are made to be opposite directions to each other, the beam deflection function is obtained. In addition, as illustrated in FIG. 15 or FIG. 16, when the directions of the current flowing through the side close to the beam of the coils 41, 42 facing with each other are made to be the same, the divergent function or focusing function is obtained. Whether the divergent function is obtained or the focusing function is obtained depends on the direction of the current to the beam traveling direction and charge polarity of the charged particle configuring the beam. The deflection function, in addition to formation of the correction trajectory, can be used for a scanning deflector for obtaining a minute two-dimensional image. These can be superimposed on the electrostatic lens, and the beam trajectory control of FIG. 12, FIG. 13 becomes possible. Although the similar function is possible with the other electromagnetic multipole, it becomes expensive due to hysteresis in a case of the magnetic pole type, and due to high precision arrangement in the vacuum in a case of the electrostatic type.

Figure 17:
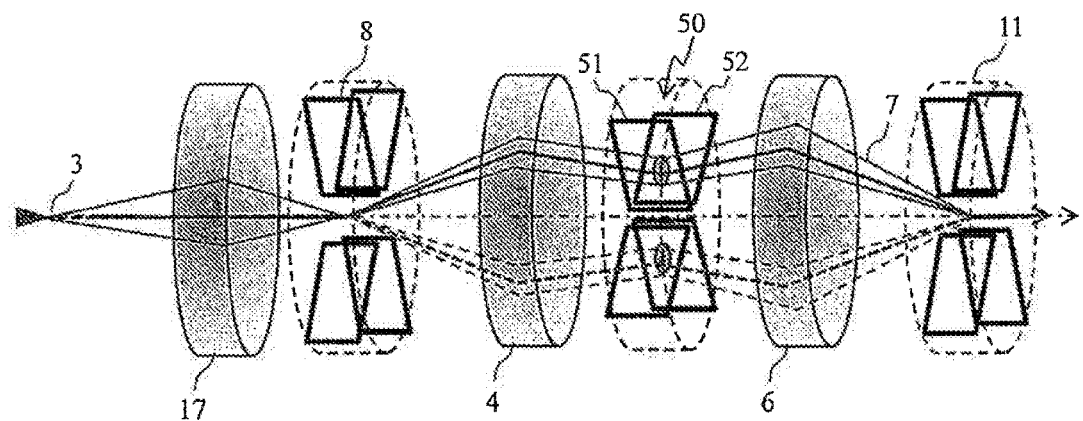
FIG. 17 is a schematic diagram illustrating a charged particle beam device utilizing other concave lens field formation method.

FIG. 17 is a schematic diagram illustrating a charged particle beam device utilizing other local concave lens field formation method. In the device of FIG. 17, the trajectory of the beam 7 emitted from the electron source 3 is formed also with the entrance deflector 8 and exit deflector 11, and entrance electrostatic lens 4, exit electrostatic lens 6. Here, an illumination lens 17 reduces in advance the finite electron source diameter not to affect at the final imaging point. A correction coil 50 has a configuration in which two toroidal coils 51, 52 are arranged radially to the optical axis of the electron optical system at cross angle θ. As illustrated in FIG. 17, two sets of correction coils 50 are arranged in origin symmetry, and when the trajectory is vertically (in two directions) reversed with the entrance deflector 8 as indicated by the solid line and dotted line, stereoscopic view of the sample becomes possible.

Figure 18:
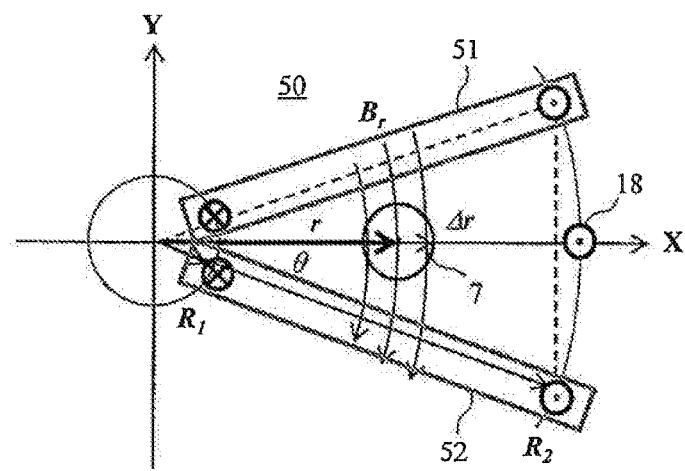
FIG. 18 is an explanatory diagram of an adjustment parameter of a toroidal uniform divergent field.
Figure 19:
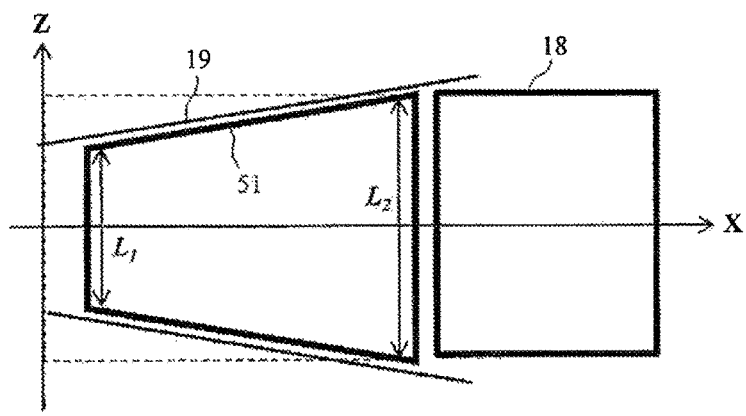
FIG. 19 is a schematic side view illustrating one toroidal coil.

FIG. 18 is a schematic diagram of a relationship between the correction coil 50 and the beam 7 illustrated in FIG. 17 viewed from the axial direction, and an explanatory diagram of the adjustment parameter of the toroidal uniform divergent field. FIG. 19 is a schematic side view illustrating one toroidal coil 51 configuring the correction coil 50 illustrated in FIG. 18.

In the optical system of the charged particle beam device illustrated in FIG. 17, as illustrated in FIG. 18, by making the beam 7 pass through outside the correction coil 50, that is, between the two toroidal coils 51, 52, the concave lens function is generated. As illustrated in FIG. 19, when the current flows through the coil 51 having a trapezoidal shape outline whose upper side and lower side are parallel to the optical system central axis and in which length of the upper side near the central axis is $L_1$ and length of the lower side far from the central axis is $L_2$, a rotational magnetic field Br is generated penetrating the coil 51. At this time, when $L_1 < L_2$, the lens function can be made to be stronger toward the outside trajectory. The parallel current lines are configured by the upper side and the lower side extending parallel to the optical axis of the above trapezoidal shape toroidal coils 51, 52, and the divergent function or focusing function is generated depending on the direction in which the current flows. In FIG. 19, when the current flows in the counter-clockwise direction, it becomes a divergent lens to the electron beam on the paper surface. Here, when θ is narrow, a strong field can be formed; however, uniformity of the magnetic field is reduced, so that they are in a trade-off relationship. With consideration to the symmetry of the magnetic field distribution of the correction coil 50, the passing range of the beam 7 receives a uniform divergent function by being made to be an intermediate angle.

As illustrated in FIG. 18, the toroidal correction coil 50 forms substantially arc-like rotation magnetic field Br near the center. Therefore, a wider uniform divergent field is formed, and the electron beam 7 is able to pass the region indicated by the circular cross-section while receiving the uniform function. Here, in addition to the coil cross angle θ of FIG. 18, coil effective length $L_1$, $L_2$ indicated in FIG. 19, an auxiliary coil 18 is arranged in the outside, a linear first-order field to the amount of off-axis r and a third-order field in the beam cross-section Δr are formed. To form these fields with high precision, magnetic field numerical calculation is required; however, when it is simplified, it depends on coil line length seen from the central axis. Therefore, the length can be determined as first-order+third-order function of the coordinates $R_1$, $R_2$ in which $L_1$, $L_2$ are positioned respectively. When the coil becomes long and large, the auxiliary coil 18 is arranged. In addition, the magnetic field generated by the current flowing through the side connecting the upper side and lower side of the correction coils 51, 52 directly affects the beam 7, however by providing an reverse current coil 19 secondarily along the upper and lower current lines of the correction coils 51, 52, cancellation is possible. For power supply to the reverse current coil 19, since exactly the same current flows as of the correction coils 51, 52, the reverse current coil can be wired close to the correction coils 51, 52, and connected in series in the opposite direction of the circuit.

Figure 20:
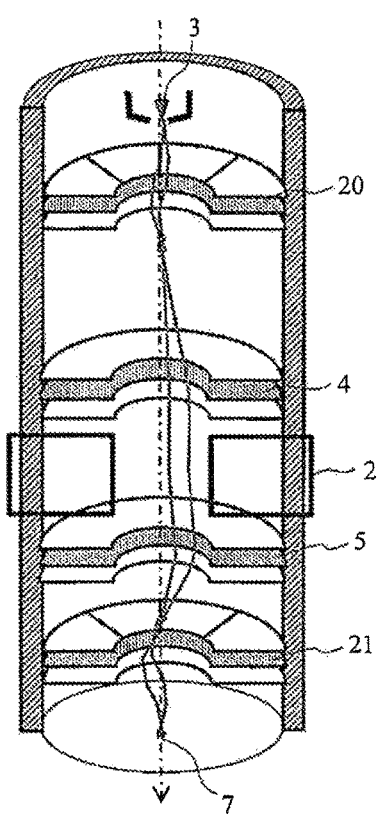
FIG. 20 is a schematic diagram illustrating an application example to a beam inclination optical system using an electrostatic lens.

FIG. 20 is a schematic diagram illustrating an application example to a beam inclination optical system of a charged particle beam device adopting all electrostatic lens systems. The beam 7 emitted from the electron source 3 is separated from the axis by the entrance electrostatic lens 4 and an illumination deflection lens 20 in which: a part of the electrode part is multipole-divided in the rotation direction; voltage application becomes possible; and a deflection function is given, and enters the divergent field of the correction coil 2 configured by N=2 system and N=4 system. Further, a multipole-divided object deflection lens 21 is arranged at the exit side, and a scanning image can be obtained. When the divergent field is formed with an electrostatic type quadrupole instead of N=2 system correction coil in the illustrated all electrostatic multipole configuration, the chromatic dispersion can be suppressed that is dominant in the focused ion beam system having isotope atoms being separated depending on the specific charge in the magnetic field.

Figure 21:
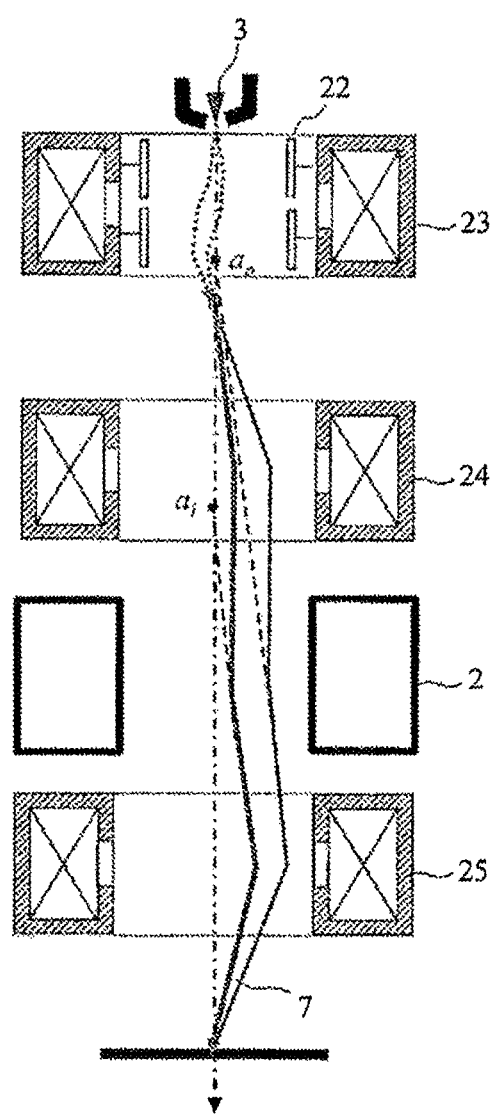
FIG. 21 is a schematic diagram illustrating an application example to a beam inclination optical system using a magnetic field lens.

Similarly, FIG. 21 is a schematic diagram illustrating an application example to a beam inclination optical system of a charged particle beam device having an optical system configured by a magnetic field lens. The beam 7 emitted from the electron source 3 forms a correction trajectory to the correction coil 2 configured by the N=2 system and N=4 system with the entrance magnetic field lens 24 and illumination magnetic field lens 23 including an inclination deflector 22, and is swung back with object magnetic field lens 25. Here, due to the concave lens function with the correction coil 2, a virtual image position moves from $a_i$, $a_o$ in the inside and outside trajectory of the beam 7, and the aberration due to the convex lens function of the object magnetic field lens 25 can be canceled. In addition, the scanning image is obtained by superimposing the scanning signal on the correction coil 2.

Adjustment and control of the charged particle beam device illustrated in FIG. 20 and FIG. 21 are performed according to the procedures described with the charged particle beam device of FIG. 12. For example, the entrance magnetic field lens 24 and object magnetic field lens 25 of FIG. 21 correspond to the entrance electrostatic lens 4, exit electrostatic lens 6 respectively. That is, the beam is once imaged on the axis, and the divergent function is added while the beam is separated from the axis with the correction coil 2. These can be controlled in conjunction with each other via a certain relationship expression.

Here, as an inevitable result of the configuration of the charged particle beam device illustrated in FIG. 20 and FIG. 21, the beam can be inclined. For example, when the output polarity of the entrance deflector 22 is switched, the trajectory is reversed to the rotational symmetry axis, and a stereo image due to parallax can be obtained.

Figure 22:
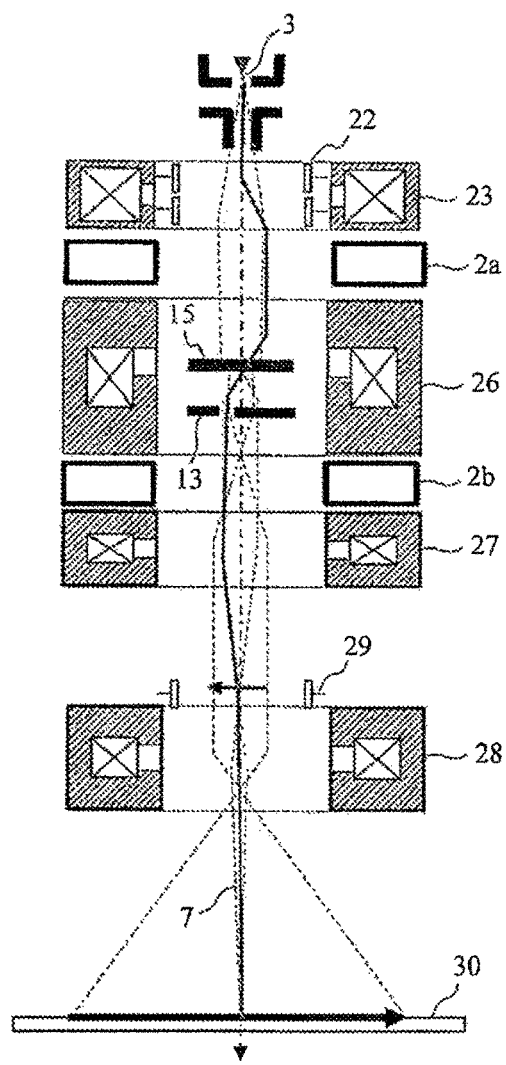
FIG. 22 is a diagram of an application to a transmission electron microscope and an inclination trajectory.

FIG. 22 is a diagram illustrating an example of applying the present invention to a transmission electron microscope (TEM) or a scanning transmission electron microscope (STEM). The axis trajectory of the beam 7 is indicated by the solid line, and the off-axis trajectory, that is, the imaging relationship diagram is indicated with the dotted line. First, for the application to the STEM, the beam 7 emitted from the electron source 3 enters an upper correction coil 2a via the entrance deflector 22 and illumination magnetic field lens 23, and is subjected to the aberration correction in the STEM mode, and forms a scanning image of the sample 15 via an illumination object lens 26. Here, when deflection for operating the beam inclination angle is added to the correction coil 2a, contrast observation becomes possible of a minute crystal orientation and the like.

Next, in the TEM mode, the entrance trajectory to a lower correction coil 2b is adjusted with the focusing function of the illumination object lens 26 and restriction diaphragm 13 in FIG. 22. As a result, by counteracting via the concave lens function of the correction coil 2b to the convex lens function of the illumination object lens 26, first projection lens 27, and second projection lens 28, the sample image is projected with no aberration on a projection plane (CCD) 30. In this case, it becomes dark field observation; however, for bright field observation, the beam 7 can be inclined via the correction coil 2a for the STEM. An example of a specific trajectory is indicated by the solid line in FIG. 22. Here, the beam 7 is separated from the axis in parallel via the entrance deflector 22, and the aberration of the illumination system is corrected via the preceding correction coil 2a, and the beam 7 is emitted to be inclined to the sample 15 via the illumination object lens 26. The beam 7 passing through the sample 15 again becomes the parallel trajectory via the strong magnetic field of the illumination object lens 26, and the aberration is corrected via the subsequent correction coil 2b, and then the axis of the beam 7 is returned to be vertical to the projection plane (CCD) 30 via a swing back deflector 29. The TEM, whose sample is minute, has a mechanical rotation stage, and the beam inclination is significant as an observation function.

The adjustment and control of the device illustrated in FIG. 22 finally make the off-axis from the subsequent correction coil 2b with a function of the illumination object lens 26. Therefore, the amount of off-axis is determined with the illumination deflector considering the lens function, and correction coil current is set. These can be controlled in conjunction with each other via a certain relationship expression.

Capability of correcting the chromatic and aperture (spherical) aberrations of the TEM makes high resolution observation possible in a thick sample in which energy loss is large, and significantly improves the contrast transfer function (CTT). In high acceleration, in a case of the correction coil 2, in particular, high-order correction sensitivity becomes a problem in a weak field. For example, since the third-order correction sensitivity is proportional to the fourth power of the coil diameter, a smaller diameter, decelerating electrode, resistance value reduction by cryogenic cooling, or super conducting coil can be provided.

Incidentally, the present invention is not limited to the above-described embodiment, and includes various modifications. For example, the above-described embodiment is the one described in detail to clearly illustrate the present invention, and is not necessarily limited to the one including all the configurations described. In addition, it is possible to replace part of a configuration of an embodiment with a configuration of another embodiment, and it is possible to add a configuration of an embodiment to a configuration of another embodiment. In addition, for part of a configuration of each embodiment, it is possible to add, remove, and replace another configuration.

REFERENCE SIGNS LIST 1 multipole
2 correction coil
3 electron source
4 entrance electrostatic lens
5 decelerating electrode
6 exit electrostatic lens
7 beam
8 entrance deflector
9 entrance astigmatism corrector
10 exit astigmatism corrector
11 exit deflector
12 vacuum chamber
13 restriction diaphragm
14 detector
15 sample (image plane)
16 magnetic field shield
17 illumination lens
18 auxiliary coil
19 reverse current coil
20 illumination deflection lens
21 object deflection lens
22 inclination deflector
23 illumination magnetic field lens
24 entrance magnetic field lens
25 object magnetic field lens
26 illumination object lens
27 first projection lens
28 second projection lens
29 object restriction diaphragm
30 restriction diaphragm projection plane (CCD)
31 swing back deflector

The invention claimed is:

1. A charged particle beam device comprising:
a charged particle source;
a rotationally symmetric lens system through which a charged particle beam generated from the charged particle source passes;
an electromagnetic field generating unit configured to generate N-fold symmetry electromagnetic field (N is a natural number of 2 or more) around the optical axis, the electromagnetic field generating unit including a pair of parallel current lines parallel to an optical axis of the charged particle beam; and
an entrance deflector arranged at a side of the electromagnetic field generating unit closer to the charged particle source than an entrance side of the electromagnetic field generating unit and configured to deflect the charged particle beam on an axis in a direction perpendicular to a line connecting the pair of parallel current lines or in a vicinity thereof in a plane perpendicular to a rotationally symmetric axis of the lens system,
wherein the entrance deflector is configured to deflect the charged particle beam passing through the lens system such that the charged particle beam enters a local divergent field formed in an off-axis region of the N-fold symmetry electromagnetic field, and
wherein the local divergent field has a range of a radius of R/3 from a center of a space through which the charged particle beam passes except for the center, where, as viewed in a plane perpendicular to the rotational symmetry axis of the lens system, the center is the position of the rotational symmetry axis, and R is a distance from the center to the parallel current lines.

2. The charged particle beam device according to claim 1, wherein the electromagnetic field generating unit includes N parallel current lines arranged around the optical axis outside the space through which the charged particle beam passes.

3. The charged particle beam device according to claim 2, wherein
an inside part of a toroidally wound coil functions as the parallel current lines, and the inside part of the toroidally wound coil is arranged inside a magnetic field shield, and the rest part of the toroidally wound coil is arranged outside the magnetic field shield.

4. The charged particle beam device according to claim 1, wherein
the electromagnetic field generating unit is a magnetic field type multipole or an electrostatic type multipole.

5. The charged particle beam device according to claim 1, wherein
the electromagnetic field generating unit generates a 2-fold symmetry electromagnetic field and a 4-fold symmetry electromagnetic field such that the respective local divergent fields overlap with each other, and the charged particle beam is made to enter the local divergent fields overlapping with each other.

6. The charged particle beam device according to claim 5, further comprising: two parallel current lines arranged around the optical axis for generating the 2-fold symmetry electromagnetic field, and four parallel current lines arranged around the optical axis for generating the 4-fold symmetry electromagnetic field outside the space through which the charged particle beam passes, wherein a chromatic aberration and an aperture aberration of the charged particle beam are corrected based on a magnitude of current flowing through the parallel current lines.

7. The charged particle beam device according to claim 1, wherein
the lens system includes a first lens arranged at the entrance side to the electromagnetic field generating unit, and a second lens arranged at an exit side to the magnetic field generating unit.

8. The charged particle beam device according to claim 7, wherein
the first lens and the second lens are electrostatic lenses.

9. The charged particle beam device according to claim 7, further comprising:
an exit deflector arranged at the exit side of the electromagnetic field generating unit.

10. The charged particle beam device according to claim 9, wherein
an entrance angle and an exit angle are substantially symmetric to each other, while being parallel to the optical axis at substantially a midpoint of the electromagnetic field generating unit via the entrance deflector, the exit deflector, and the first lens.

11. A charged particle beam device comprising:
a charged particle source;
a rotationally symmetric lens system through which a charged particle beam generated from the charged particle source passes;
an electromagnetic field generating unit configured to generate N-fold symmetry electromagnetic field (N is a natural number of 2 or more) around the optical axis, the electromagnetic field generating unit including a pair of parallel current lines parallel to an optical axis of the charged particle beam; and
an entrance deflector arranged at a side of the electromagnetic field generating unit closer to the charged particle source than an entrance side of the electromagnetic field generating unit and configured to deflect the charged particle beam to a direction perpendicular to a line connecting the pair of parallel current lines,
wherein an aberration of the charged particle beam due to the lens system is corrected by deflecting the charged particle beam passing through the lens system via the entrance deflector to make the charged particle beam to enter a local divergent field formed in an off-axis region of the N-fold symmetry electromagnetic field, and
wherein an astigmatism corrector including two sets of parallel current lines arranged to be shifted 45 degrees from each other around the optical axis, is installed at the entrance side and an exit side to the electromagnetic field generating unit.

12. A charged particle beam device comprising:
a charged particle source;
a rotationally symmetric lens system through which a charged particle beam generated from the charged particle source passes;
an electromagnetic field generating unit configured to generate N-fold symmetry electromagnetic field (N is a natural number of 2 or more) around the optical axis, the electromagnetic field generating unit including a pair of parallel current lines parallel to an optical axis of the charged particle beam;
an entrance deflector arranged at a side of the electromagnetic field generating unit closer to the charged particle source than an entrance side of the electromagnetic field generating unit and configured to deflect the charged particle beam to a direction perpendicular to a line connecting the pair of parallel current lines; and
a first astigmatism corrector arranged at the entrance side of the electromagnetic field generating unit, and a second astigmatism corrector arranged at the exit side of the electromagnetic field generating unit,
wherein an aberration of the charged particle beam due to the lens system is corrected by deflecting the charged particle beam passing through the lens system via the entrance deflector to make the charged particle beam to enter a local divergent field formed in an off-axis region of the N-fold symmetry electromagnetic field,
wherein the lens system includes a first lens arranged at the entrance side to the electromagnetic field generating unit, and a second lens arranged at an exit side to the magnetic field generating unit, and
wherein the first lens and the second lens are electrostatic lenses.

13. A charged particle beam device comprising:
a charged particle source;
a rotationally symmetric lens system through which a charged particle beam generated from the charged particle source passes;
a correction coil unit configured to generate a local rotating magnetic field around the optical axis;
an electromagnetic field generating unit configured to generate N-fold symmetry electromagnetic field (N is a natural number of 2 or more) around the optical axis, the electromagnetic field generating unit including a pair of parallel current lines parallel to an optical axis of the charged particle beam; and
an entrance deflector arranged at the entrance side of the correction coil unit and configured to deflect the charged particle beam on an axis in a direction perpendicular to a line connecting the pair of parallel current lines or in a vicinity thereof in a plane perpendicular to a rotationally symmetric axis of the lens system,
wherein the entrance deflector is configured to deflect the charged particle beam passing through the lens system such that the charged particle beam enters the local rotating magnetic field formed with the correction coil unit, and
wherein the local rotating magnetic field has a range of a radius of R/3 from a center of a space through which the charged particle beam passes except for the center, where, as viewed in a plane perpendicular to the rotational symmetry axis of the lens system, the center is the position of the rotational symmetry axis, and R is a distance from the center to the parallel current lines.

14. A charged particle beam device comprising:
a charged particle source;
a rotationally symmetric lens system through which a charged particle beam generated from the charged particle source passes;
a correction coil unit configured to generate a local rotating magnetic field around the optical axis;
an electromagnetic field generating unit configured to generate N-fold symmetry electromagnetic field (N is a natural number of 2 or more) around the optical axis, the electromagnetic field generating unit including a pair of parallel current lines parallel to an optical axis of the charged particle beam; and
an entrance deflector arranged at the entrance side of the correction coil unit and configured to deflect the charged particle beam to a direction perpendicular to a line connecting the pair of parallel current lines, wherein
an aberration of the charged particle beam due to the lens system is corrected by deflecting the charged particle beam passing through the lens system via the entrance deflector to make the charged particle beam enter the local rotating magnetic field formed with the correction coil unit, and the correction coil unit includes two sets of toroidally wound coils radially arranged from the optical axis, and the toroidally wound coil has a trapezoidal shape whose upper side and lower side are parallel to the optical axis and the length of the lower side far from the optical axis is longer than the length of the upper side near the optical axis, and the local rotating magnetic field is generated in a space sandwiched by the two sets of toroidally wound coils with parallel current lines configured by the upper side and the lower side.

* * * * *